(12) United States Patent
Choi et al.

(10) Patent No.: US 7,709,824 B2
(45) Date of Patent: May 4, 2010

(54) AC-DRIVEN LIGHT EMITTING DEVICE HAVING SINGLE ACTIVE LAYER STRUCTURE AND MANUFACTURING METHOD THEREOF

(75) Inventors: Won Kook Choi, Seoul (KR); Dong Hee Park, Seoul (KR); Sang Yub Ie, Goyang-si (KR); Dong Ick Son, Seoul (KR); Ji Won Choi, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 12/360,514

(22) Filed: Jan. 27, 2009

(65) Prior Publication Data

US 2010/0032645 A1    Feb. 11, 2010

(30) Foreign Application Priority Data

Aug. 5, 2008    (KR) .................... 10-2008-0076710

(51) Int. Cl.
*H01L 29/06*   (2006.01)
(52) U.S. Cl. .................... 257/13; 257/40; 257/E51.018
(58) Field of Classification Search .................. 438/99; 257/13, 22, 40, E51.027, E21.09, E51.018
See application file for complete search history.

(56) References Cited

U.S. PATENT DOCUMENTS 6,999,222 B2 *   2/2006   Bazan et al. ................ 359/248
7,326,908 B2 *   2/2008   Sargent et al. ............ 250/214.1
2009/0126796 A1 *   5/2009   Yang et al. .................... 136/263

OTHER PUBLICATIONS

Kim, Jin Young, et al.: "Efficient Tandem Polymer Solar Cells Fabricated by All-Solution Processing", *Science*, 317, 222 (2007), pp. 222-225 with cover page.
Huynh, Wendy U., et al.: "Hybrid Nanorod-Polymer Solar Cells", *Science*, 295, 2425 (2002), pp. 2425-2427 with cover page.

(Continued)

*Primary Examiner*—W. David Coleman
*Assistant Examiner*—Christine Enad
(74) *Attorney, Agent, or Firm*—Frommer Lawrence & Haug LLP; Ronald R. Santucci

(57) ABSTRACT

The present invention relates to an AC voltage-driven light emitting device having a single active layer of a core-shell structure (p-i-n structure) in which intrinsic semiconductor nanocrystals, exciton combination centers, are uniformly and isotropically distributed around p-type polymer particles, and n-type small molecular particles surround the semiconductor nanocrystals and p-type polymer, and a manufacturing method thereof. An active layer of a core-shell structure using a polymer-semiconductor nano hybrid in the light-emitting device has an inversion symmetry characteristic showing the same current-voltage characteristic during application of a voltage in a forward direction and a reverse direction. Therefore, due to this inversion symmetry characteristic, the light emitting can be driven by even an AC voltage. Also, since the device can be driven by an AC voltage, limitations of an existing DC voltage-driven organic light emitting diode, that is, destruction or a defect of the device by an overcurrent and generation of a dark spot by degradation of local constituent organic materials are solved.

15 Claims, 6 Drawing Sheets

OTHER PUBLICATIONS

Durr, Michael, et al.: "Low-Temperature Fabrication of Dye-Sensitized Solar Cells by Transfer of Composite Porous Layers", *nature materials*, vol. 4, Aug. 2005, pp. 607-611.

Campoy-Quiles, Mariano, et al.: "Morphology evolution via self-organization and lateral and vertical diffusion in polymer:fullerene solar cell blends", *nature materials*, vol. 7, Feb. 2008, pp. 158-164.

* cited by examiner

AC-DRIVEN LIGHT EMITTING DEVICE HAVING SINGLE ACTIVE LAYER STRUCTURE AND MANUFACTURING METHOD THEREOF

CROSS-REFERENCE TO RELATED APPLICATION

This application claims under 35 U.S.C. §119(a) the benefit of Korean Patent Application No. 10-2008-0076710 filed on Aug. 5, 2008, the entire contents of which are incorporated herein by reference.

BACKGROUND (a) Technical Field

The present invention relates to a light emitting device and a manufacturing method thereof. More particularly, the present invention relates to a light emitting device having a single active layer of a core-shell structure (p-i-n structure) in which intrinsic semiconductor nanocrystals, which serve as exciton combination centers, are uniformly and isotropically distributed around p-type polymer particles, and n-type small molecular particles surround the semiconductor nanocrystals and p-type polymer particles, and that can be driven even by an AC voltage, and a manufacturing method thereof.

(b) Background Art

With rapid progress of electric and electronic technology, electric devices and electronic apparatuses of various functions are under development. For example, various electric devices such as light emitting devices emitting light using an electrical signal, memory devices for storing information, short/long distance wireless communication devices, and sensor devices are under development. Also, displays, or various portable devices such as cellular phones, MP3 players, and digital cameras, information and telecommunication apparatuses are under active development.

The things to be considered with top priority in performing researches to develop electric devices and apply these electric devices to an electronic apparatus of various functions are: miniaturization of the electric devices or electric apparatuses, manufacture of lightweight slim devices or apparatuses, and increase of integration degree and portability to reduce manufacturing costs while improving the reliability of the devices or apparatuses.

The traditional studies on the driving of a general display including a hybrid polymer-quantum dot light emitting device have been mainly focused on devices using a DC voltage. Particularly, a superluminescent diode (SLD) using a quantum dot structure as an active layer has been widely studied.

Also, manufacturing a light emitting diode (LED) using silicon or a compound semiconductor in Group III-Group VI is well known in the art. It has been recently known that when quantum dots (QDs) having a size of about 10 nm or less are dispersed inside an insulator and a voltage is applied to both ends of the insulator, light emission by the quantum dots are generated [K. A. Littau et al., A Luminescent Silicon Nanocrystal Colloid via a High-temperature Aerogel Reaction, J. Phys, Chem, 97, 1224 (1993); P. Mutti et al., Room-temperature visible luminescence from silicon nanocrystals in silicon implemented $SiO_2$, Appl. Phys. Lett., 66 851 (1995); B. O. Dabbousi et al., electroluminescence from close quantum-dot/polymer composites, Appl. Phys. Lett., 66, 1316 (1995)].

In most cases, electroluminescence (EL) is not obtained by manufacturing a device and applying a voltage to it, but a photoluminescence of simply sending light and measuring coming light has been reported. There has been also a report on an LED manufactured by dispersing quantum dots inside a polymer matrix. Here, when the size of a quantum dot is 7.5 nm, light having a wavelength of 920 nm is emitted. As the size of a quantum dot reduces, light having a shorter wavelength is emitted. For example, it has been reported that when the size of a quantum dot is 3.2 nm, light having a wavelength of 660 nm is emitted [K. A. Littau et al., A Luminescent Silicon Nanocrystal Colloid via a High-temperature Aerogel Reaction, J. Phys, Chem, 97, 1224 (1993)]. Recently, various light emitting devices are manufactured by dispersing nano particles in polymers and small molecules, and piling them in a single layer or multiple layer structure.

However, an existing light emitting device having a hybrid polymer-nano particle structure can be driven by only a DC voltage. In a device driven by a DC voltage, the life of the device may reduce or polymers may degrade due to an overcurrent, so that the device may unstably operate.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention has been made in an effort to solve the above-described problems associated with prior art. The present invention provides a light emitting device that can be driven by even an AC voltage to solve problems of a prior art DC voltage-driven organic light emitting diode, that is, destruction or a defect of the device by an overcurrent, and generation of a dark spot by degradation of local constituent organic materials.

In one aspect, the present invention provides an AC-driven light emitting device having a single active layer structure, the device including: a glass substrate; a first electrode including a transparent electrode on the glass substrate; an active layer of a single layer on the first electrode; and a second electrode on the active layer, wherein the active layer has a p-i-n structure of a consolidated core-shell structure in which semiconductor nanocrystals are adsorbed on the surface of a polymer core including p-type polymer organic materials, and uniformly and isotropically distributed to surround the polymer core, and n-type small molecular organic materials surround the semiconductor nanocrystals and p-type polymer.

In a preferred embodiment, the p-type polymer organic materials may be poly(N-vinylcarbazole) (PVK), the n-type small molecular organic materials may be 1,3,5-tirs-(N-phenylbenzimidazol-2-yl) benzene (TPBi), and the semiconductor nanocrystals may be CdSe/ZnS quantum dots.

In another preferred embodiment, the second electrode may be a transparent electrode, so that electroluminescence (EL) is generated in both directions while the device is driven by an AC voltage.

In another aspect, the present invention provides a method for manufacturing an AC-driven light emitting device having a single active layer structure, the method including: forming a first electrode using a transparent electrode on a glass substrate; adding p-type polymer organic materials, semiconductor nanocrystals, and n-type small molecular organic materials into a solvent to manufacture a mixed solution, and spin-coating the mixed solution on the first electrode/glass structure to form an active layer on the first electrode; and forming a second electrode on the active layer.

In a preferred embodiment, the mixed solution may be manufactured by adding 0.6-1 weight % of the p-type polymer organic materials, 0.4-1 weight % of the n-type small molecular organic materials, and 0.5-1 weight % of the semiconductor nanocrystals into 100 weight % of the solvent.

In another preferred embodiment, poly(N-vinylcarbazole) (PVK) may be used as the p-type polymer organic materials, 1,3,5-tirs-(N-phenylbenzimidazol-2-yl) benzene (TPBi) may be used as the n-type small molecular organic materials, and CdSe/ZnS quantum dots may be used as the semiconductor nanocrystals.

In still another preferred embodiment, the spin-coating may be performed at a rotational speed of 1000-3000 rpm for a rotation time of 10-30 seconds to obtain a coating thickness of 100-200 nm.

In yet another preferred embodiment, a transparent electrode is formed using the second electrode, so that electroluminescence (EL) is generated in both directions while the device is driven by an AC voltage.

Accordingly, a light emitting device and a manufacturing method thereof provides the following advantages.

1) An active layer of a core-shell structure using a polymer-semiconductor nano hybrid in a light-emitting device according to the present invention has an inversion symmetry characteristic showing the same current-voltage characteristic during application of a voltage in a forward direction and a reverse direction. Therefore, due to this inversion symmetry characteristic, the light emitting device according to the present invention can be driven by even an AC voltage.

2) Since the device can be driven by an AC voltage, limitations of an existing DC voltage-driven organic light emitting diode, that is, destruction or a defect of the device by an overcurrent and generation of a dark spot by degradation of local constituent organic materials are solved.

3) Since a single active layer is used, a light emitting device can be manufactured using simple structure and method compared to an existing multi-layered structure formed by stacking a hole transport layer, an active layer, and an electron transport layer. Since the device can be easily reproduced at low manufacturing costs, advantageous process technology in an aspect of economical efficiency can be realized and used.

4) Since the device is manufactured as an AC voltage-driven device that can generate electroluminescence in different directions, a display that can emit light in both directions can be manufactured when transparent electrodes are used as the first and second electrodes, which are drive electrodes on both sides of the active layer.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

DETAILED DESCRIPTION

Hereinafter reference will now be made in detail to various embodiments of the present invention, examples of which are illustrated in the accompanying drawings and described below. Terms used in the present invention are intended to explain a specific embodiment and not to limit the present invention. A singular expression includes a plural expression unless clearly expressed otherwise. Terms such as "include" and "have" in the present invention should be understood to designate existence of a characteristic, a number, a step, an operation, an element, a part, or a combination thereof on the specification, and not exclude one or more other characteristics, numbers, steps, operations, parts, or a combination thereof or possibility of addition.

The present invention relates to an AC-driven LED having a single active layer of a consolidated core-shell structure, and a manufacturing method thereof.

Here, the active layer formed as a single layer has a p-i-n structure in which intrinsic semiconductor nanocrystals, exciton combination centers, are uniformly and isotropically distributed around p-type polymer organic particles, and n-type small molecular organic particles surround the semiconductor nanocrystals and p-type polymers. At this point, a polymer-semiconductor nano hybrid is formed inside the active layer. The polymer-semiconductor nano hybrid has a structure in which the semiconductor nanocrystals are adsorbed on the surface of a polymer core including p-type polymer organic particles (hole transport materials) to surround the polymer core. Polymer-semiconductor nano hybrids are uniformly dispersed inside the n-type small molecular organic materials (particles) (electron transport materials) to form the active layer of the consolidated core-shell structure.

Figure 1A:
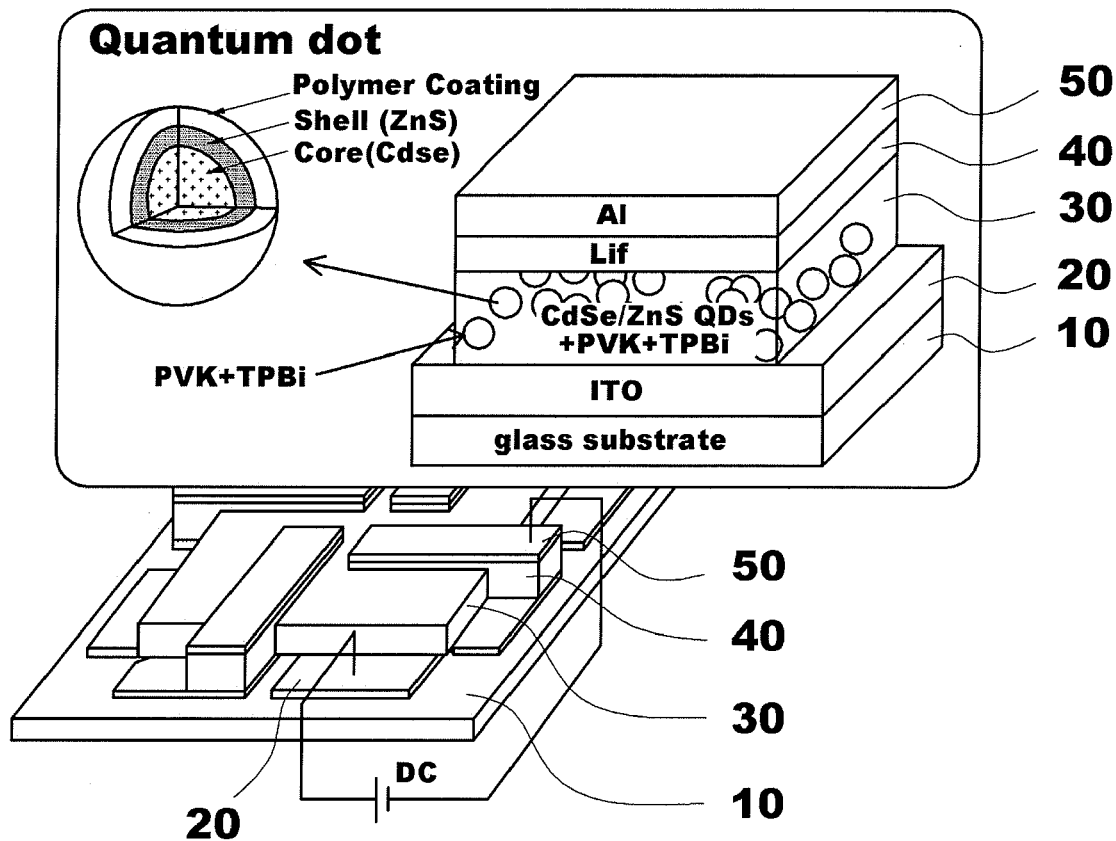
FIGS. 1A to 1C are views illustrating the construction of a light emitting device according to a preferred embodiment of the present invention.
Figure 1B:
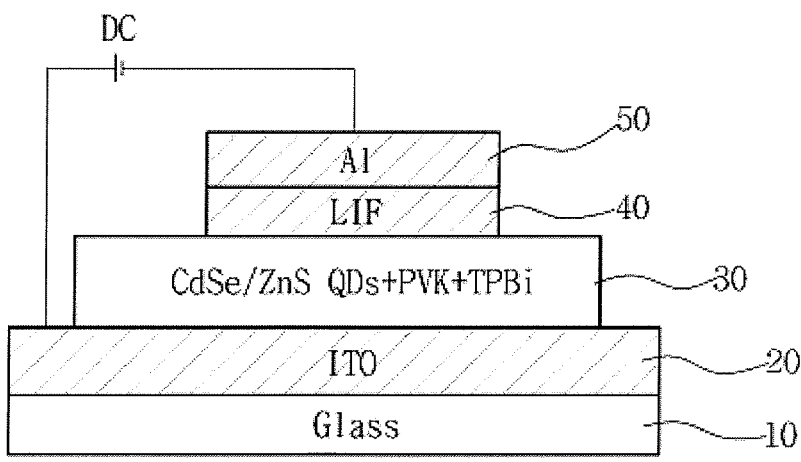
Figure 1C:
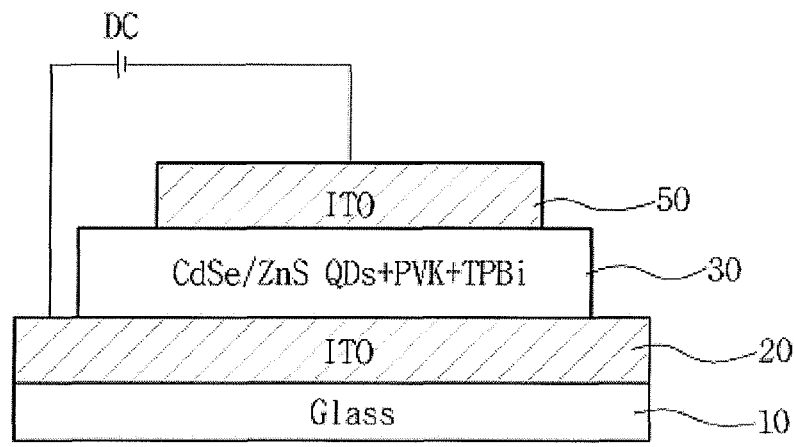

In a light emitting device according to a preferred embodiment of the present invention, poly(N-vinylcarbazole) (PVK) can be used as the p-type polymer organic material, CdSe/ZnS quantum dots (QDs) can be used as the semiconductor nanocrystals, and 1,3,5-tirs-(N-phenylbenzimidazol-2-yl) benzene (TPBi) can be used as the n-type small molecular organic materials as illustrated in FIGS. 1A to 1C. That is, a single active layer of a p(PVK)-I(CdSe/ZnS QDs)-n(TPBi) structure can be formed. In the p(PVK)-I(CdSe/ZnS QDs)-n (TPBi) structure, CdSe/ZnS core-shell quantum dots are uniformly and isotropically distributed around the PVK particles, and the TPBi particles surround the CdSe/ZnS core-shell quantum dots.

At this point, a polymer-quantum dot hybrid in which the CdSe/ZnS quantum dots surround the PVK is formed and the TPBi surrounds the polymer-quantum dot hybrid, so that an active layer of a consolidated core-shell structure is formed.

As described above, the present invention relates to the light emitting device having a single active layer of the consolidated core-shell structure using the polymer-semiconductor nano hybrid, and the manufacturing method thereof. According to the present invention, a first electrode (lower electrode) as a transparent electrode is stacked on a glass substrate, the above-described single active layer is then stacked on the first electrode, and a second electrode (upper electrode) is stacked on the single active layer.

According to the present invention, the active layer of the core-shell structure using the polymer-semiconductor nano hybrid has an inversion symmetry showing the same current-voltage characteristic during application of a voltage in a forward direction and a reverse direction as described later. This inversion symmetry allows the light emitting device of the present invention to be driven by an AC voltage, so that convenience of the light emitting device improves, reduction in an occupying area is achieved, and efficiency improves. That is, the semiconductor nanocrystals are uniformly and isotropically distributed around the p-type polymer particles (polymer-semiconductor nano hybrid is formed) serving as a hole transport layer inside the single active layer, and the n-type small molecular particles serving as an electron transport layer surround the semiconductor nanocrystals, so that the device can be driven by an AC voltage applied to electrodes at both ends using a driving principle described later.

Since the device is driven by an AC voltage as described above, an excellent light emitting device, as compared to most of existing DC voltage-driven organic light emitting devices, that can minimize essential limitations such as destruction or a defect of the device by an overcurrent, and generation of a dark spot by degradation of local constituent organic materials can be manufactured.

Also, since a single active layer is used, a light emitting device can be manufactured using simple structure and method compared to an existing multi-layered structure formed by stacking a hole transport layer, an active layer, and an electron transport layer. Since the device can be easily reproduced at low manufacturing costs, advantageous process technology in an aspect of economical efficiency can be realized and used.

Also, since the device is manufactured as an AC voltage-driven device that can generate electroluminescence in different directions, a display that can emit light in both directions can be manufactured when transparent electrodes are used as the first and second electrodes, which are drive electrodes on both sides of the active layer.

Hereinafter, a preferred embodiment of the present invention is described in more detail with reference to the accompanying drawings.

FIGS. 1A to 1C are views illustrating the construction of a light emitting device according to a preferred embodiment of the present invention, and are schematic views illustrating a realization example of a light emitting device having a single active layer of a core-shell structure using a mixture polymer-semiconductor nano hybrid (polymer-quantum spot hybrid) that can be driven by an AC voltage.

First, referring to FIGS. 1A and 1B, the light emitting device formed using a glass substrate 10, a first electrode (indium-tin-oxide (ITO) transparent electrode) 20, a single active layer 30, and a second electrode (Al electrode) 50, is shown. The light emitting device is realized by forming the ITO electrode (first electrode) 20 of a predetermined pattern on the glass substrate 10, forming the single active layer 30 on the ITO electrode 20, and sequentially stacking a LiF electrode 40 and an Al electrode (second electrode) 50 on the single active layer 30. Here, the single active layer 30 includes CdSe/ZnS quantum dots (QDs), PVK, and TPBi.

FIG. 1A also illustrates a CdSe/ZnS quantum dot (QD) structure used in the present invention. This structure is a CdSe/ZnS core-shell structure in which a ZnS shell surrounds a CdSe core. In the light emitting device of the present invention, the CdSe/ZnS core-shell quantum dots are distributed to uniformly surround the surface of a p-type polymer, which is a hole transport material, inside the active layer.

Also, the single active layer 30 in the light emitting device of the present invention includes the above quantum dots, hole transport materials, and electron transport materials. For example, the single active layer 30 can include PVK as the hole transport materials and include TPBi as the electron transport material. To form the single active layer, the CdSe/ZnS quantum dots, PVK, and TPBi are added to a solvent, e.g., toluene at a predetermined ratio. After that, the mixed solution of the CdSe/ZnS quantum dots, PVK, and TPBi is coated on the surface of the ITO/glass substrate using spin coating, and soft baking is performed to remove the solvent. After the single active layer 30 is formed as described above, LiF 40 and Al 50 are sequentially deposited using thermal evaporation equipment to form the electrodes.

The light emitting device of the present invention manufactured using the above-described method can generate electroluminescence using an AC driving of a cathode and an anode through isotropic distribution of quantum dots, which will be described later.

Also, for another embodiment of the present invention, in case of forming both the first and second electrodes 20 and 50 using transparent electrodes, for example, ITO electrodes, a bidirectional transparent electroluminescence display that can generate electroluminescence in both directions while driven by an AC voltage can be manufactured.

Hereinafter, a manufacturing process of the light emitting device according to the present invention will be described below in more detail.

1) Forming Electrodes

It is a process of forming an electrode on the glass substrate. As an example of the electrode, an ITO thin layer is deposited on the glass substrate, and an ITO electrode of a predetermined pattern is then formed through an etching process.

2) Manufacture of a Mixed Solution

P-type polymer organic materials as hole transport materials, n-type small molecular organic materials as electron transport materials, and semiconductor nanocrystals are added to a solvent to manufacture a mixed solution used in forming the single active layer.

For example, PVK as the p-type polymer organic materials, TPBi as the n-type small molecular organic materials, and CdSe/ZnS core-shell quantum dots as semiconductor nanocrystals, having a structure shown in FIG. 1A are mixed using toluene as a solvent. For 100 weight(wt)% of the solvent, about 0.6-1 wt % of the p-type polymer organic materials, about 0.4-1 wt % of the n-type small molecular organic materials, and 0.5-1 wt % of the semiconductor nanocrystals are mixed to manufacture the mixed solution. To change the electrical property of a finally manufactured device, a ratio at which the semiconductor nanocrystals, i.e., CdSe/ZnS core-shell quantum dots is mixed can be properly changed within the above range during this process.

Here, in case of mixing less than 0.6 wt % of the p-type polymer organic materials as the hole transport materials, the physical bonding with the semiconductor nanocrystals (quantum dots) becomes weakened, thus resulting in a structural problem in forming a p-i-n structure. On the other hand, in case of mixing more than 1 wt % of the p-type polymer organic materials, there will be a problem in the physical bondings with the semiconductor nanocrystals and mixing with an organic solvent may not be completely performed due to saturation in the weight of a hole transport layer, so that surface roughness of a thin layer becomes large during a spin coating and thus an interfacial layer with an electrode cannot be formed properly.

Also, in forming the p-i-n structure using the physical bonding between the semiconductor nanocrystals (quantum dots), the hole transport layer, and the electron transport layer, when less than 0.4 wt % of the n-type small molecular organic materials as the electron transport materials are mixed, the amount of the electron transport layer used is not sufficient, thus resulting in limitation in forming of an n-type layer, which is a shell structure formed on the outer side. On the other hand, when more than about 1 wt % of the n-type small molecular organic materials is mixed, the semiconductor nanocrystals, and materials of the hole transport layer and the electron transport layer are not completely mixed with one another. Particularly, as a use amount of the electron transport layer increases, the forming of the n-type layer, which is the shell structure formed on the outer side, is saturated to push the semiconductor nanocrystals sticking to the hole transport layer through physical bonding, thereby reducing physical bonding of a p-i structure, so that luminescence efficiency is reduced and a limitation is generated to the surface roughness of a thin layer and forming of the n-type layer during deposition.

When less than 0.5 wt % of the semiconductor crystals (quantum dots) is mixed, the frequency at which the semiconductor crystals physically bond to the hole transport layer becomes lowered thus reducing luminescence efficiency. On the other hand, when more than 1 wt % of the semiconductor crystals is mixed, the amount at which the semiconductor nanocrystals physically bond to the hole transport layer becomes saturated, so that a mixture mixed to the organic materials of the hole transport layer and the electron transport layer tends to increase the surface roughness of a thin layer during deposition, thus having an adverse effect on an interfacial layer during deposition of the electrode.

P-type conducting organic polymer materials such as PVK can be used as the hole transport material forming the single active layer. In addition to PVK, any p-type conducting organic polymer material selected from the group consisting of poly[1-methoxy-4-(2-ethethylhexyloxy-2,5-phenylenevinylene)](MEH-PPV), poly(phenylene vinylene)(PPV), polyfluorenes (PFO), and poly(9,9-hdioctylfluorenyl-2,7-diyl) end capped with dimethylphenyl (PFO-DMP) may be used.

Also, n-type conducting small molecular organic materials such as TPBi can be used as the electron transport material forming the single active layer. In addition to TPBi, any n-type conducting small molecular organic material selected from the group consisting of N'-Diphenyl-N,N'-bis(3-methylphenyl)-1,1'-biphenyl-4,4'-diamine (TPD), 2-(4-Biphenylyl)-5-(4-tert-butylphenyl)-1,3,4-oxadiazole (PBD), 2,9-Dimethyl-4,7-diphenyl-1,10-phenanthroline (BCP), and 4,7-Diphenyl-1,10-phenanthroline (Bphen) may be used.

Also, CdSe/ZnS core-shell quantum dots as core-shell type quantum dots can be used as the semiconductor nanocrystals forming the single active layer. Examples of similar materials to be used are ZnCdSe/ZnS quantum dots, Si/SiO$_2$ quantum dots, Si nanocrystals, Cu-doped ZnS nanocrystals, and ZnO nanoparticles.

Also, In addition to toluene, CHCl$_3$ and dimethyl formamide (DMF) may be used as a solvent.

3) Thin Layer Coating for Forming Single Active Layer

The mixed solution where the CdSe/ZnS quantum dots, PVK, and TPBi are mixed is spin-coated on the ITO/glass substrate, so that a thin layer is formed. The thicknesses of PVK and TPBi thin layers can be precisely controlled by controlling a density ratio of PVK and TPBi to the solvent during this process and a rotational speed and rotation time during the spin coating process. In a preferred embodiment, the spin coating process is performed at a rotational speed of 1000-3000 rpm for 10-30 seconds such that the thickness of the coated thin layer is in the range of 100-200 nm while the mixed solution is coated on the substrate.

Here, when the spin coating is performed at a rotational speed of less than 1000 rpm, surface roughness and the thickness of the thin layer increase, and an interface between an electrode and an emission layer gets worse, thus raising difficulty in manufacturing the light emitting device. Also, when the spin coating is performed at a rotational speed of more than 3000 rpm, the surface roughness and the thickness of the thin layer decrease, and the interface between the electrode and the emission layer becomes defective, thus raising difficulty in manufacturing the light emitting device.

Also, when the spin coating is performed for less than about 10 seconds, the surface roughness and the thickness of the thin layer increase, and the interface between the electrode and the emission layer becomes incomplete, thus raising difficulty in manufacturing the light emitting device. On the other hand, when the spin coating is performed for more than about 30 seconds, the surface roughness and the thickness of the thin layer decrease, and the interface between the electrode and the emission layer becomes defective, thus raising difficulty in manufacturing the light emitting device.

In addition, the thickness of the coated thin layer is limited to the range of about 100-200 nm in order to obtain an optimized efficiency of the light emitting device.

Figure 2:
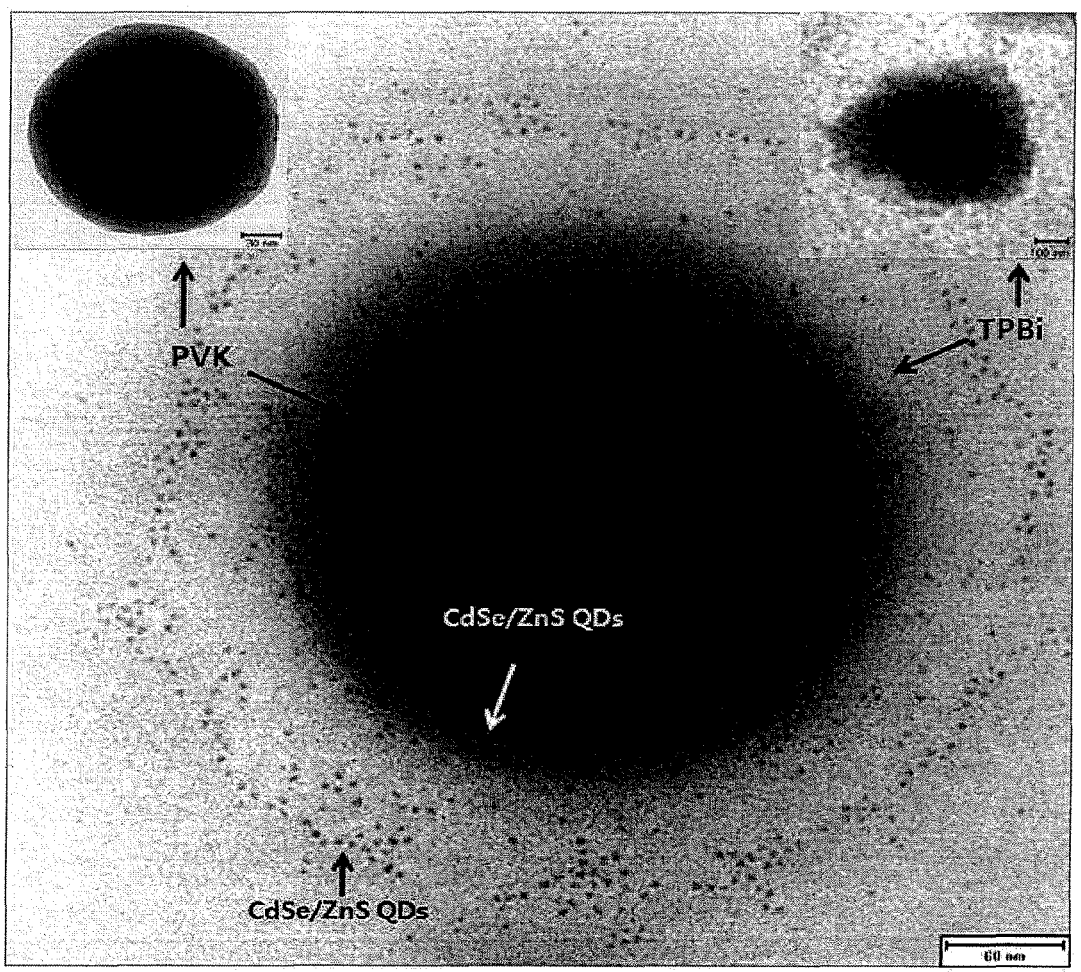
FIG. 2 is a TEM image illustrating the fine structure of a consolidated mixture polymer-quantum dot hybrid forming a single active layer in a light emitting device of the present invention.
Figures 3, 4A:
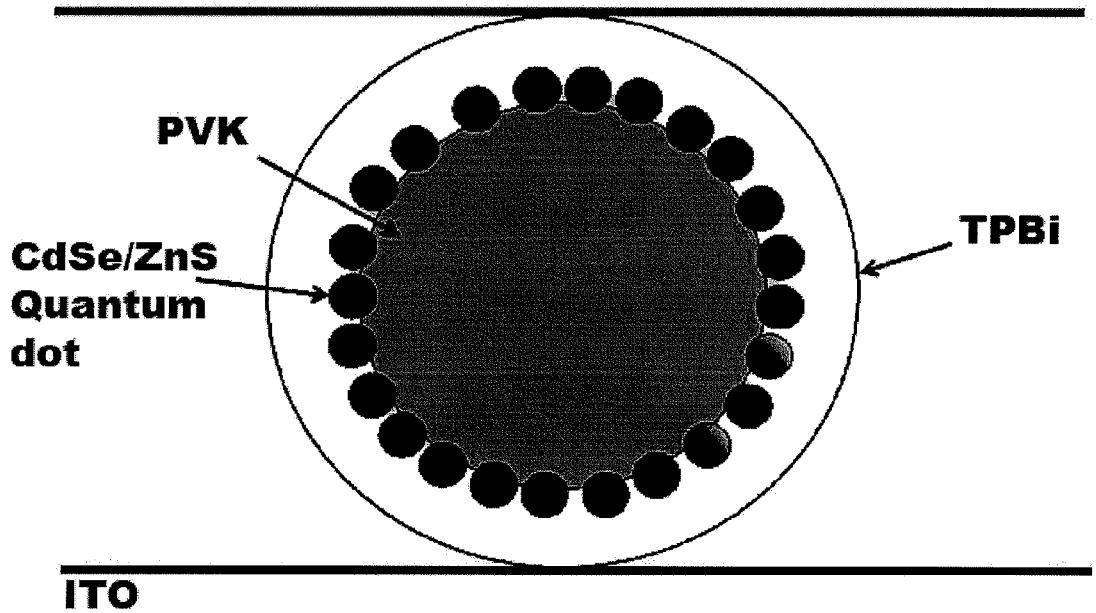
FIG. 3 is a schematic view made on the basis of the TEM image of FIG. 2, illustrating a case where a voltage is not applied.
FIG. 4A is a schematic view illustrating a state when a DC voltage is applied in a forward direction in the structure of FIG. 3.

Therefore, according to the present invention, the spin coating process is performed at a rotational speed of 1000-3000 rpm for 10-30 seconds such that the thickness of the coated thin layer becomes 100-200 nm in order to form the p-i-n structure of FIGS. 2 and 3.

4) Thin Layer Heat Treatment for Forming Single Active Layer

Subsequently, soft baking is performed to remove the solvent. For example, heat is applied at 100° C. for about 10 minutes to remove toluene used as the solvent. Through this process, as illustrated in FIGS. 2 and 3, the CdSe/ZnS quantum dots are adsorbed in the surface of PVK, and TPBi surrounds the CdSe/ZnS quantum dots distributed or embedded in the surface of PVK, so that the single active layer of the p-i-n structure can be completed. That is, the semiconductor nanocrystals (CdSe/ZnS quantum dots) are uniformly and isotropically distributed around the p-type polymer organic particles (PVK), and the n-type small molecular organic particles (TPBi) surround the semiconductor nanocrystals, so that the active layer of the p-i-n structure is formed. At this point, the p-type polymer organic materials (particles) (PVK), the semiconductor nanocrystals (CdSe/ZnS quantum dots) surrounding the p-type polymer organic particles (PVK), and the n-type small molecular organic materials (particles) form a consolidated core-shell structure.

5) Forming Electrodes

LiF and Al are sequentially deposited on the above-formed single active layer using a patterned mask to form an electrode (second electrode) of a predetermined pattern.

6) Forming Driving Circuit

A driving circuit for the device is formed. After the first electrode (ITO electrode), the single active layer of the consolidated core-shell structure, and the second electrode (Al electrode) are formed, a circuit is configured so that an AC voltage is applied between the ITO electrode, which is the first electrode, and the Al electrode, which is the second electrode as illustrated in FIGS. 1A to 1C.

With this structure, the light emitting device manufactured using the above-described process can be driven by an AC voltage applied between the two electrodes according to the isotropic distribution of the quantum dots and a driving principle described later. Also, when both the first electrode and the second electrode are formed using transparent electrodes, for example, ITO electrodes, a bidirectional transparent electroluminescence display that can generate electroluminescence in both directions while driven by an AC voltage can be manufactured.

In the process of the present invention, the kind of the solvent, the use range of each material, the process condition of the spin coating, and the thickness of the thin layer of the single active layer are important in order to simultaneously dissolve the p-type polymer, the intrinsic semiconductor nanocrystals, and the n-type small molecular materials and consolidate them in a core-shell shape of the p-i-n structure illustrated in FIGS. 2 to 3. Particularly, the polymer-semiconductor nano hybrid where the semiconductor nano crystals (quantum dots) are uniformly and isotropically distributed in the surface of the p-type polymer core can be formed by the process conditions proposed by the present invention.

FIG. 2 is a transmission electron microscopy (TEM) photo illustrating the fine structure of a consolidated mixture polymer-quantum dot hybrid forming a single active layer in a light emitting device of the present invention. FIG. 2 is a photograph captured by a TEM in order to obtain exact information for the polymer-quantum dot hybrid structure in a light emitting device according to the embodiment of FIGS. 1A and 1B. The TEM image shows the fine structure of the polymer-quantum dot hybrid using PVK, TPBi, and CdSe/ZnS core-shell quantum dots as materials forming a single active layer.

The p-i-n structure illustrated in FIG. 2 is formed by mixing 0.5 wt % of PVK, 0.6 wt % of TPBi, and 0.4 wt % of CdSe/ZnS core-shell quantum dots with respect to 100 wt % of toluene to form a mixed solution, spin-coating the mixed solution on the ITO/glass substrate, and performing soft baking for removing the solvent. At this point, the spin coating is performed at a rotational speed of 2000 rpm for 20 seconds to form a thin layer having a thickness of 150 nm.

Referring to the photo of FIG. 2, the quantum dots having a size of several nm physically adsorb on the surface of the PVK polymer having a size of 100-200 nm, and are uniformly and isotropically distributed in only the neighborhood of the PVK surface, and the small molecular organic materials called TPBi surround PVK and the quantum dots on the whole in a consolidated shape. That is, the TEM photo shows p (PVK)-i (CdSe/ZnS)-n (TPBi) structure is formed. The inserted sub-photographs show a PVK polymer particle and TPBi small molecular particle as observed by the TEM.

FIG. 3 is a schematic view made on the basis of the TEM image of FIG. 2, illustrating a case where a voltage is not applied. Organic materials called TPBi surround the PVK polymer between the ITO electrode, which is the first electrode, and the Al electrode, which is the second electrode. Of course, the quantum dots are formed between the PVK polymer and TPBi. FIG. 3 is a schematic view on the basis of the above-described p-i-n structure. In the p-i-n structure, electroluminescence is generated by isotropic distribution of quantum dots using an AC driving of a cathode and an anode as described later.

FIG. 4A is a schematic view illustrating a state when a DC voltage is applied in a forward direction in the structure of FIG. 3. While the DC voltage is applied in the forward direction, holes (+) are created from the ITO electrode and attracted by electrons (−) created by the Al electrode, so that holes (+) and electrons (−) recombine inside the quantum dots in the upper side above the central dotted line, that is, inside the quantum dots close to the Al electrode and thus light emission occurs.

Figure 4B:
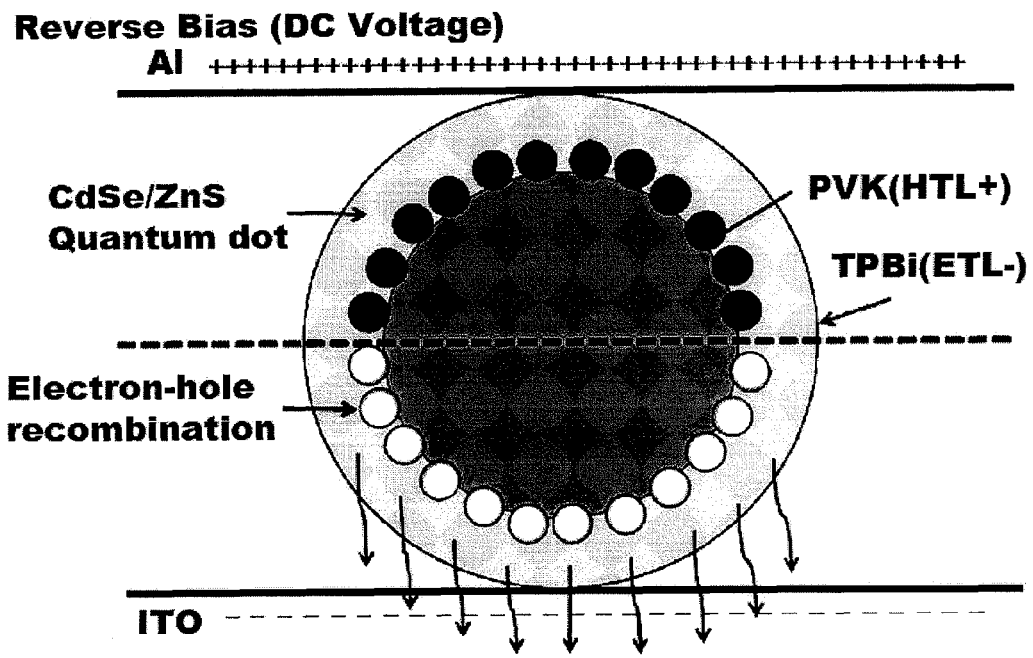
FIG. 4B is a schematic view illustrating a state when a DC voltage is applied in a reverse direction in the structure of FIG. 3.

FIG. 4B is a schematic view illustrating a state when a DC voltage is applied in a reverse direction in the structure of FIG. 3. While the DC voltage is applied in the reverse direction, holes (+) are created from the Al electrode, and electrons created from the ITO electrode move along TPBi to recombine with the holes (+) inside the quantum dots close to the ITO electrode, and thus light emission occurs.

Referring to FIGS. 4A and 4B, it is inferred that the device can be driven by an AC voltage. In fact, the inventor has verified that the device emits light when an AC voltage of a sine wave whose peak-to-peak value is ±12V is applied between the Al electrode and the ITO electrode. It is similar to drive the device using the forward DC voltage and the reverse DC voltage successively. While the sine wave has ±12V, holes (+) from the Al electrode recombine with electrons (−) coming through TPBi inside the quantum dots close to the Al electrode to emit light. On the other hand, while the sine wave has −12V, holes (+) from the ITO electrode recombine with electrons (−) coming through TPBi inside the quantum dots close to the ITO electrode to emit light.

Figure 5:
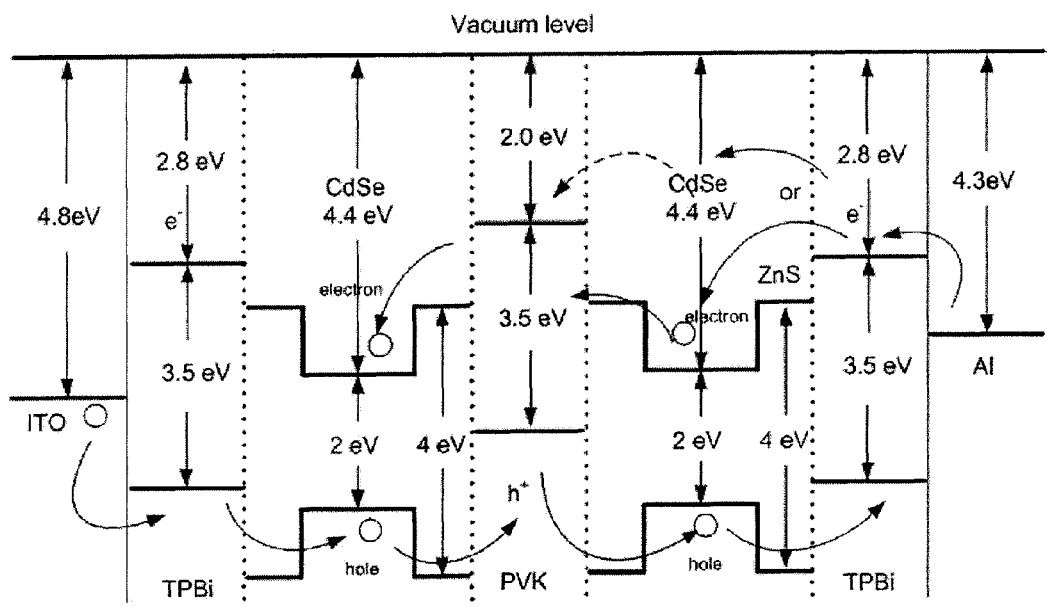
FIG. 5 is an energy band diagram of a mixture polymer-semiconductor structure in a light emitting device of the present invention.

FIG. 5 is an energy band diagram of a mixture polymer-semiconductor structure in a light emitting device of the present invention. FIG. 5 illustrates the energy level of each organic material and quantum dot. This diagram shows a light emission region through hole-electron recombination. In FIG. 5, while a forward voltage is applied, an electron is injected through the Al electrode and moves up to a TPBi lowest unoccupied molecular orbital (LUMO) level through hopping mechanism. An electron moves from the TPBi LUMO level to the next CdSe quantum dot along the following two paths. According to one path, an electron moves to a CdSe quantum dot and is confined therein. According to the other path, an electron moves to the PVK polymer material through Fowler-Nordheim (F-N) tunneling and is confined at the next CdSe quantum point. As for a hole movement path on the opposite side, a hole is injected to the ITO electrode and moves up to a TPBi highest occupied molecular orbital (HOMO) level through hopping mechanism. A hole moves from TPBi through F-N tunneling and is confined in a quantum dot, or moves to the PVK HOMO level and is confined at the next CdSe quantum dot to recombine with an electron and thus emit light. The energy level diagram of FIG. 5 shows that light emission occurs mainly at the CdSe quantum dots close to the Al electrode. This is because electrons of the Al electrode move to the next CdSe quantum dot but there is difficulty by an energy level for a majority of electrons to move to the next CdSe quantum dot. Therefore, a primary recombination region in this structure is the CdSe quantum dot level close to the Al electrode. On the other hand, while the reverse voltage is applied, light emission occurs mainly at the CdSe quantum dots close to the ITO electrode.

Figure 6:
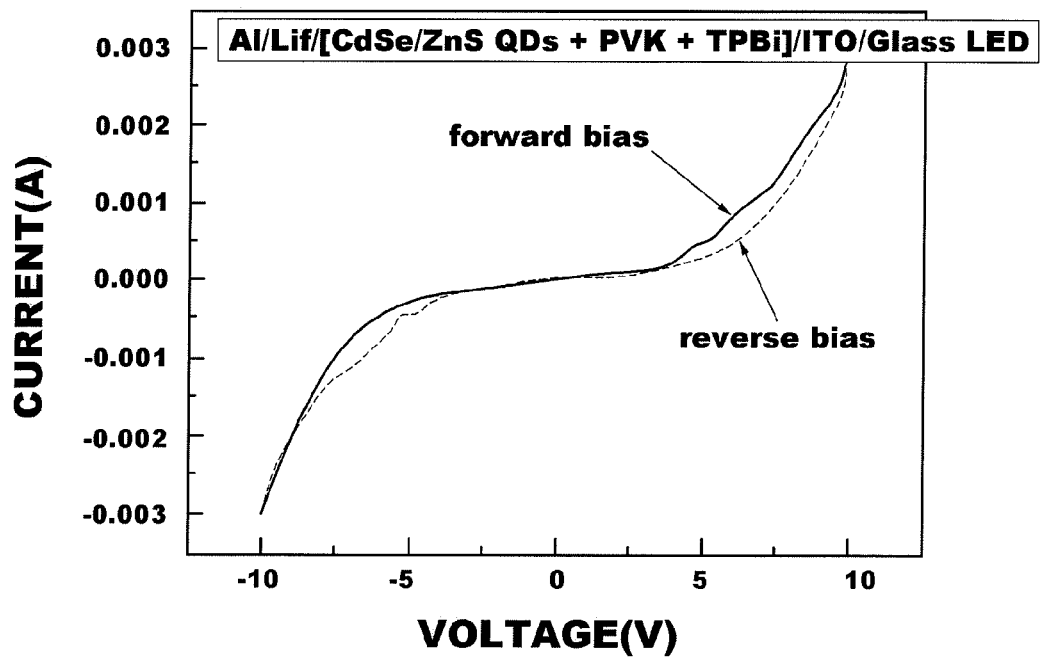
FIG. 6 is a current-voltage (I-V) measurement curve of a light emitting device according to the present invention.

FIG. 6 is a current-voltage (I-V) measurement curve of a light emitting device (refer to the embodiment of FIGS. 1A and 15B) according to the present invention. The curve formed of black square symbols represents a case in which a forward bias is applied. A turn-on voltage is about 6V. The curve formed of circular symbols represents a reverse bias is applied. When the curve showing the case of the reverse bias is moved symmetrically with respect to the origin and compared with the current-voltage curve showing the case of the forward voltage, an almost similar characteristic curve is obtained, which demonstrates the device of the present invention has an inversion symmetry characteristic. The foregoing coincides with the description of the schematic structures for the cases where the forward voltage is applied and the reverse voltage is applied in FIG. 3.

Figure 7A:
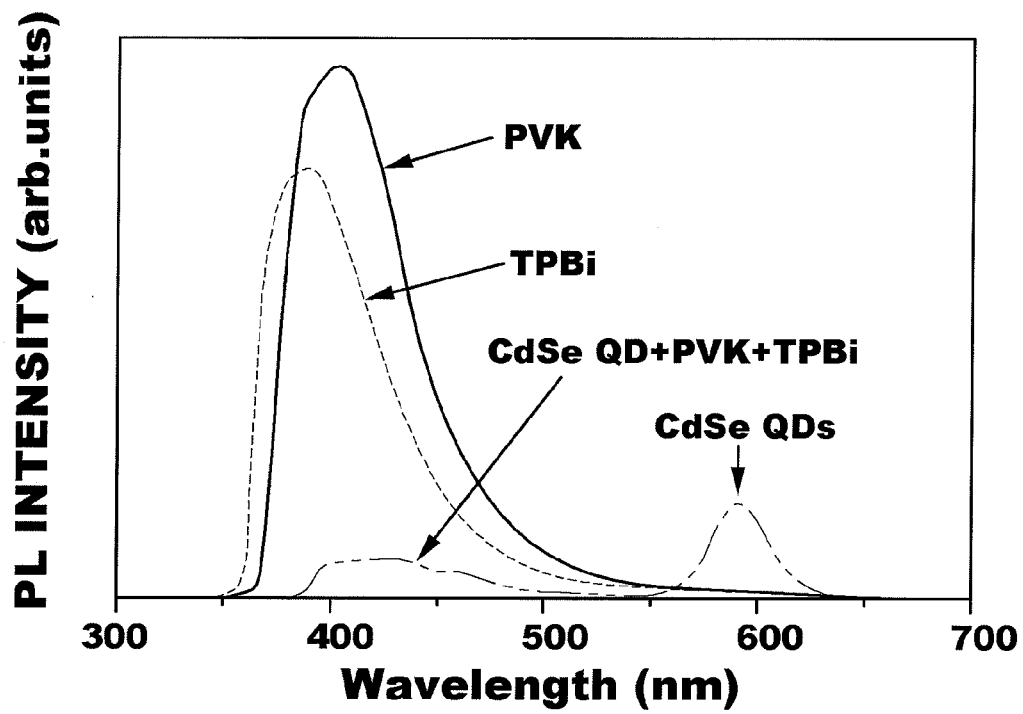
FIG. 7A is a view illustrating a photoluminescence (PL) measurement curve for a light emitting device of the present invention.

FIG. 7A is a view illustrating a photoluminescence (PL) measurement curve for a light emitting device (the embodiment of FIGS. 1A and 1B) of the present invention. Light emission from PVK and TPBi particles has been observed over the region of 400-500 nm, and emission of orange light in the neighborhood of 585 nm has been observed as light emission from the CdSe semiconductor quantum dots.

Figure 7B:
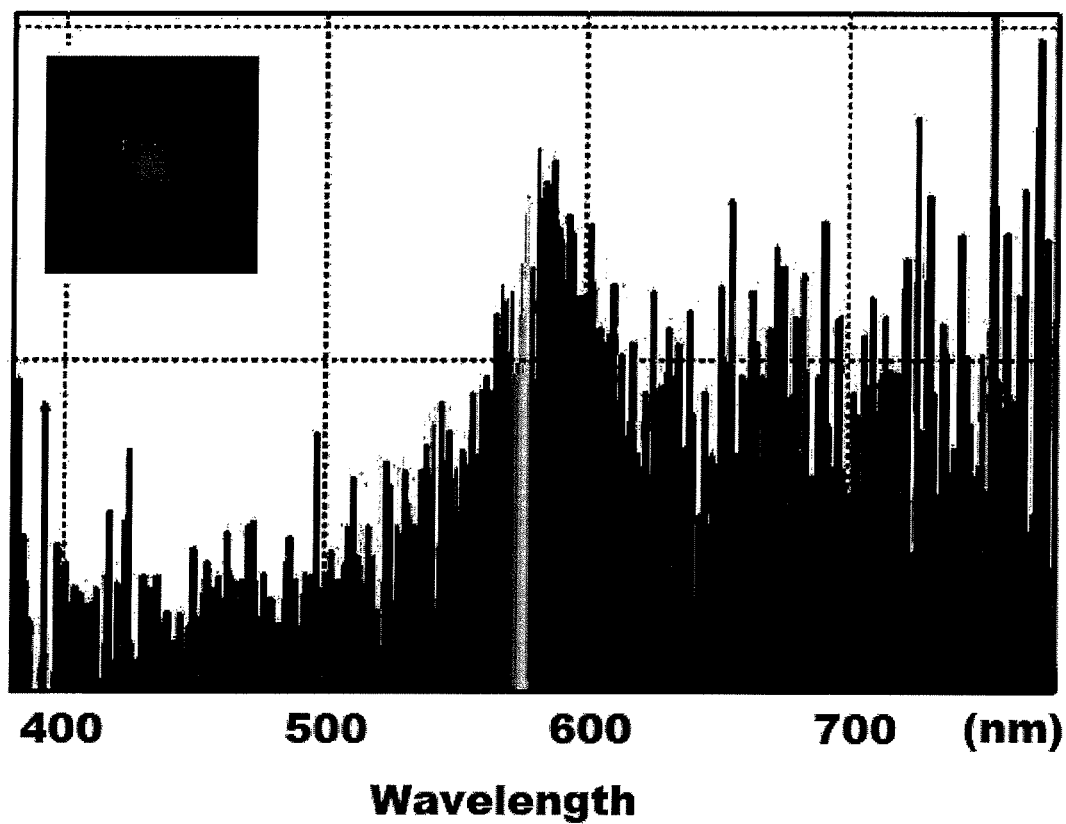
FIG. 7B is a view and luminescence photograph illustrating an electroluminescence (EL) measurement spectrum for a light emitting device of the present invention.

FIG. 7B is a view and luminescence photograph illustrating an electroluminescence (EL) measurement spectrum for a light emitting device of the present invention. FIG. 7B illustrates high intensity in the neighborhood of 585 nm as the center of light emission, and light emission from CdSe semiconductor nanoparticles well coincides with emission of orange light in the neighborhood of 585 nm.

FIGS. 7A and 7B reveal that in the light emitting device according to the present invention, the EL spectrum and the PL spectrum coincide with each other, and light emission occurs at the CdSe semiconductor quantum dots. Also, the luminescence photo of FIG. 7B illustrates color EL.

The present invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

What is claimed is:

1. An AC-driven light emitting device having a single active layer structure, the device comprising:
    a glass substrate;
    a first electrode comprising a transparent electrode on the glass substrate;
    an active layer of a single layer on the first electrode; and
    a second electrode on the active layer,
    wherein the active layer has a p-i-n structure of a consolidated core-shell structure in which semiconductor nanocrystals are implanted on the surface of a polymer core comprising p-type polymer organic materials, and uniformly and isotropically distributed to surround the polymer core, and n-type small molecular organic materials surround the semiconductor nanocrystals and p-type polymer.

2. The device of claim 1, wherein the p-type polymer organic materials comprise one selected from the group consisting of poly(N-vinylcarbazole) (PVK), poly[1-methoxy-4-(2-ethethylhexyloxy-2,5-phenylenevinylene)](MEH-PPV), poly(phenylene vinylene)(PPV), polyfluorenes (PFO), and poly(9,9-dioctylfluorenyl-2,7-diyl) end capped with dimethylphenyl (PFO-DMP).

3. The device of claim 1, wherein the n-type small molecular organic materials comprise one selected from the group consisting of 1,3,5-tirs-(N-phenylbenzimidazol-2-yl) benzene (TPBi), N'-Diphenyl-N,N'-bis(3-methylphenyl)-1,1'-biphenyl-4,4'-diamine (TPD), 2-(4-Biphenylyl)-5-(4-tert-butylphenyl)-1,3,4-oxadiazole (PBD), 2,9-Dimethyl-4,7-diphenyl-1,10-phenanthroline (BCP), and 4,7-Diphenyl-1,10-phenanthroline (Bphen).

4. The device of claim 1, wherein the semiconductor nanocrystals comprise one selected from the group consisting of CdSe/ZnS quantum dots, ZnCdSe/ZnS quantum dots, Si/SiO$_2$ quantum dots, Si nanocrystals, Cu-doped ZnS nanocrystals, and ZnO nanoparticles.

5. The device of claim 1, wherein the p-type polymer organic materials comprise poly(N-vinylcarbazole) (PVK), the n-type small molecular organic materials comprise 1,3,5-tirs-(N-phenylbenzimidazol-2-yl) benzene (TPBi), and the semiconductor nanocrystals comprise CdSe/ZnS quantum dots.

6. The device of claim 1, wherein the second electrode comprises a transparent electrode, so that electroluminescence (EL) is generated in both directions while the device is driven by an AC voltage.

7. A method for manufacturing the AC-driven light emitting device having a single active layer structure of claim 1, the method comprising:
    forming a first electrode using a transparent electrode on a glass substrate;
    adding p-type polymer organic materials, semiconductor nanocrystals, and n-type small molecular organic materials to a solvent to manufacture a mixed solution, and spin-coating the mixed solution on the first electrode/glass structure to form an active layer on the first electrode; and
    forming a second electrode on the active layer.

8. The method of claim 7, wherein the mixed solution is manufactured by adding about 0.6-1 weight % of the p-type polymer organic materials, about 0.4-1 weight % of the n-type small molecular organic materials, and about 0.5-1 weight % of the semiconductor nanocrystals to 100 weight % of the solvent.

9. The method of claim 7, wherein the p-type polymer organic materials comprise one selected from the group consisting of poly(N-vinylcarbazole) (PVK), poly[1-methoxy-4-(2-ethethylhexyloxy-2,5-phenylenevinylene)](MEH-PPV), poly(phenylene vinylene)(PPV), polyfluorenes (PFO), and poly(9,9-dioctylfluorenyl-2,7-diyl) end capped with dimethylphenyl (PFO-DMP).

10. The method of claim 7, wherein the n-type small molecular organic materials comprise one selected from the group consisting of 1,3,5-tirs-(N-phenylbenzimidazol-2-yl) benzene (TPBi), N'-Diphenyl-N,N'-bis(3-methylphenyl)-1,1'-biphenyl-4,4'-diamine (TPD), 2-(4-Biphenylyl)-5-(4-tert-butylphenyl)-1,3,4-oxadiazole (PBD), 2,9-Dimethyl-4,7-diphenyl-1,10-phenanthroline (BCP), and 4,7-Diphenyl-1,10-phenanthroline (Bphen).

11. The method of claim 7, wherein the semiconductor nanocrystals comprise one selected from the group consisting of CdSe/ZnS quantum dots, ZnCdSe/ZnS quantum dots, Si/SiO$_2$ quantum dots, Si nanocrystals, Cu-doped ZnS nanocrystals, and ZnO nanoparticles.

12. The method of claim 7, wherein poly(N-vinylcarbazole) (PVK) is used as the p-type polymer organic materials, 1,3,5-tirs-(N-phenylbenzimidazol-2-yl) benzene (TPBi) is used as the n-type small molecular organic materials, and CdSe/ZnS quantum dots are used as the semiconductor nanocrystals.

13. The method of claim 7, wherein the solvent comprises one selected from the group consisting of toluene, CHCl$_3$, and dimethyl formamide (DMF).

14. The method of claim 7, wherein the spin-coating is performed at a rotational speed of 1000-3000 rpm for a rotation time of 10-30 seconds to obtain a coating thickness of 100-200 nm.

15. The method of claim 7, wherein a transparent electrode is formed using the second electrode, so that electroluminescence (EL) is generated in both directions while the device is driven by an AC voltage.

* * * * *